United States Patent
Nitta

(10) Patent No.: US 6,275,220 B1
(45) Date of Patent: *Aug. 14, 2001

(54) FLAT PANEL TYPE DISPLAY APPARATUSES HAVING DRIVER ICS FORMED ON PLATE FOR HOLDING DISPLAY GLASSES

(75) Inventor: Hideto Nitta, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,732

(22) Filed: Mar. 17, 1998

(30) Foreign Application Priority Data

Mar. 17, 1997 (JP) .................................................. 9-062927

(51) Int. Cl.[7] ...................................................... G06G 5/00
(52) U.S. Cl. .............................. 345/204; 345/206; 345/60
(58) Field of Search ..................... 345/204, 205, 345/206, 60, 61, 63, 64, 65, 66, 67, 69, 70; 313/587; 362/249; 361/697, 709, 711, 710, 720

(56) References Cited

U.S. PATENT DOCUMENTS

| | | | |
|---|---|---|---|
| 3,590,328 | * 6/1971 | Frescura | 345/205 |
| 3,701,123 | * 10/1972 | Barrett et al. | 345/205 |
| 4,039,890 | * 8/1977 | Bailey et al. | 345/205 |
| 4,109,176 | * 8/1978 | Ernsthauen et al. | 313/587 |
| 5,008,656 | * 4/1991 | Cheriff et al. | 345/205 |
| 5,390,093 | * 2/1995 | Himeno et al. | 362/249 |

FOREIGN PATENT DOCUMENTS

| | | |
|---|---|---|
| 60-66167 | 5/1985 | (JP) . |
| 5-11183 | 2/1993 | (JP) . |
| 6-242454 | 8/1994 | (JP) . |
| 6-260531 | 9/1994 | (JP) . |
| 3005342 | 10/1994 | (JP) . |
| 8-181168 | 7/1996 | (JP) . |

\* cited by examiner

Primary Examiner—Xiao Wu
(74) Attorney, Agent, or Firm—Sughrue, Mion, Zinn, Macpeak & Seas, PLLC

(57) ABSTRACT

A reinforcing plate for reinforcing a flat panel is extended from the peripheral part of the flat panel. Driver ICs are mounted in a TAB structure on a flexible printed wiring board one end of which is connected to the flat panel by a TAB and the other end is provided on the extended part of the reinforcing plate. The driver ICs are fixed on the reinforcing plate by adhering with a heat-conductive adhesive transcription tape.

9 Claims, 5 Drawing Sheets

(LIGHT EMITTING FACE)

FLAT PANEL TYPE DISPLAY APPARATUSES HAVING DRIVER ICS FORMED ON PLATE FOR HOLDING DISPLAY GLASSES

BACKGROUND OF THE INVENTION

The present invention relates to a flat panel type display apparatus, and in particular, to package structure for driver integrated circuits (hereinafter called ICs) for a color plasma display panel (hereinafter called color PDP).

In recent years, much developmental work on PDPs has been attempted. PDP's have many driver ICs. Each driver IC produces a lot of heat because they consume a lot of power. For this reason, a PDP radiates this heat by a heat sink fitted to an IC package.

FIG. 6 shows a prior art plasma display panel. A PDP 3 is fixed on a main face of an aluminum reinforcing plate 4. The ends of the PDP 3 and the board 4 are located at the same point so as to be coincident. A driver IC is formed on an opposite side to the PDP 3 and suspended over the plate 4. In detail, a printed wiring board 2 is attached to a back side of the plate 4 via spacers 5. A quad flat package (QFP) 1A in which an IC chip 1 is sealed with resin mold is formed on the printed wiring board 2. The IC chip 1 is electrically connected to an electrode (not shown) formed on a side edge of the PDP 3 through a flexible printed wiring 6, a connecter 6a, and wiring (not shown) of the printed wiring board 2. A heat sink 7 is formed on the QFP 1A to radiate heat produced by the IC chip 1. As a result, the PDP needs a heat sink and the IC QFP in which an IC chip is sealed with molding resin which is contacted thereon with the heat sink for conducts. This structure is complex and troublesome to assemble, having inevitably high cost. Moreover it does not achieve significant heat radiation.

SUMMARY OF THE INVENTION

It is therefore an object of the present invention to provide a flat panel type display apparatuses capable of improving heat radiating performance and reducing the number of constituent parts.

A flat panel type display apparatuses according to the present invention has at least one chip fitted to a metal-built reinforcing plate installed on the rear face of the flat panel.

According to the present invention, it is possible to radiate heat generated by ICs having a high power load, (e.g, 60 V or higher with high current) through a metal-built reinforcing plate.

BRIEF DESCRIPTION OF THE DRAWINGS

The above and other objects, features and advantages of the present invention will be explained in the following description taken in conjunction with the accompanying drawings, in which.

DETAILED DESCRIPTION OF THE PREFERRED EMBODIMENTS

A first embodiment of the present invention is described with reference to FIG. 1 through FIG. 3.

Figure 3:
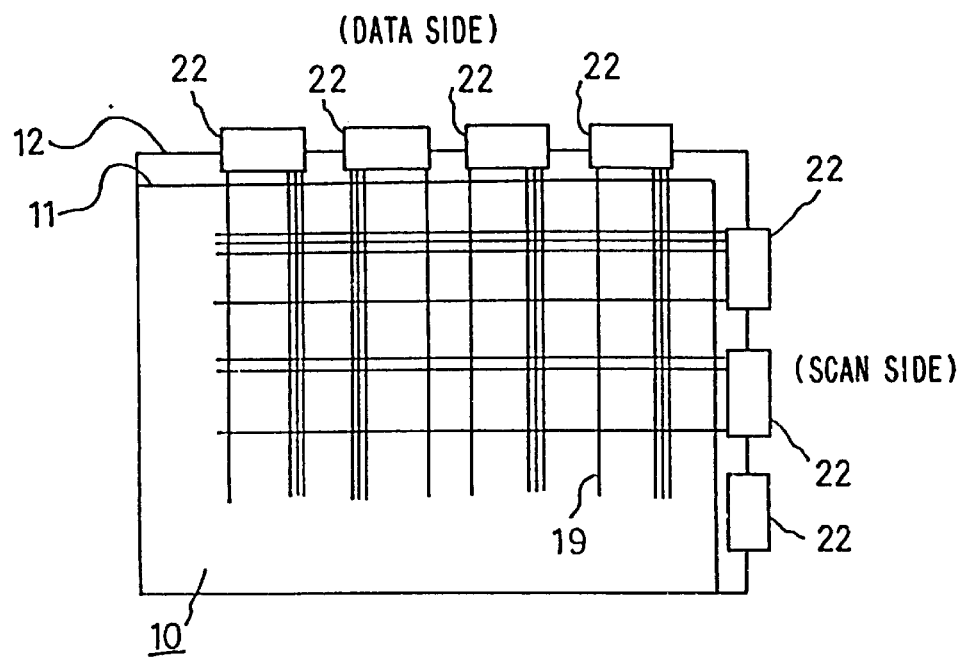
FIG. 3 is a schematic drawing for describing the relationship between a color PDP and driver ICs of the present invention.

Referring to FIG. 3, the color PDP 10 comprises signal wiring lines 19 arranged at a matrix on the vertical axis side (the data side) and the horizontal axis side (the scan side). Charge cells located at their intersections between the signal wiring lines 19 generate colors of Red, Green and Blue and emit light to display required visual images. The number of the signal wiring lines 19 will be, depending on the number of pixels, for example 480 and 600 on the scan side while that 1920 (640×3) and 2400 (800×3) is needed respectively on the data side because lines of three colors, R (red), G (green) and B (blue) are required on the data side. Furthermore, the number of signal wiring lines 19 is further increased in the case of wide television. Signal wiring lines 19 arranged at a fine pitch are therefore required on the data side.

Figure 1:
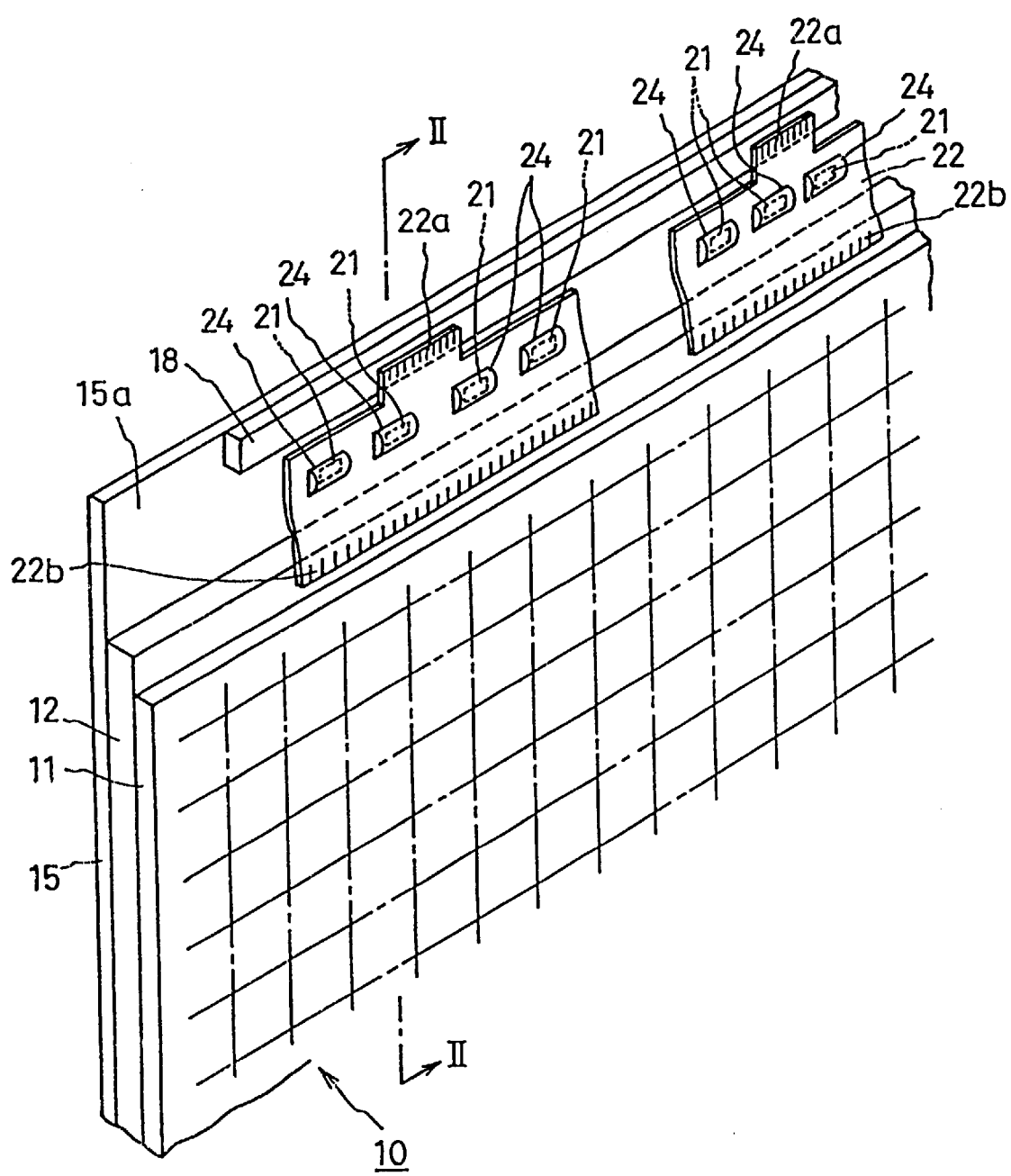
FIG. 1 is a perspective view illustrating the essential part of a first embodiment of a flat panel type display apparatus according to the present invention.
Figure 2:
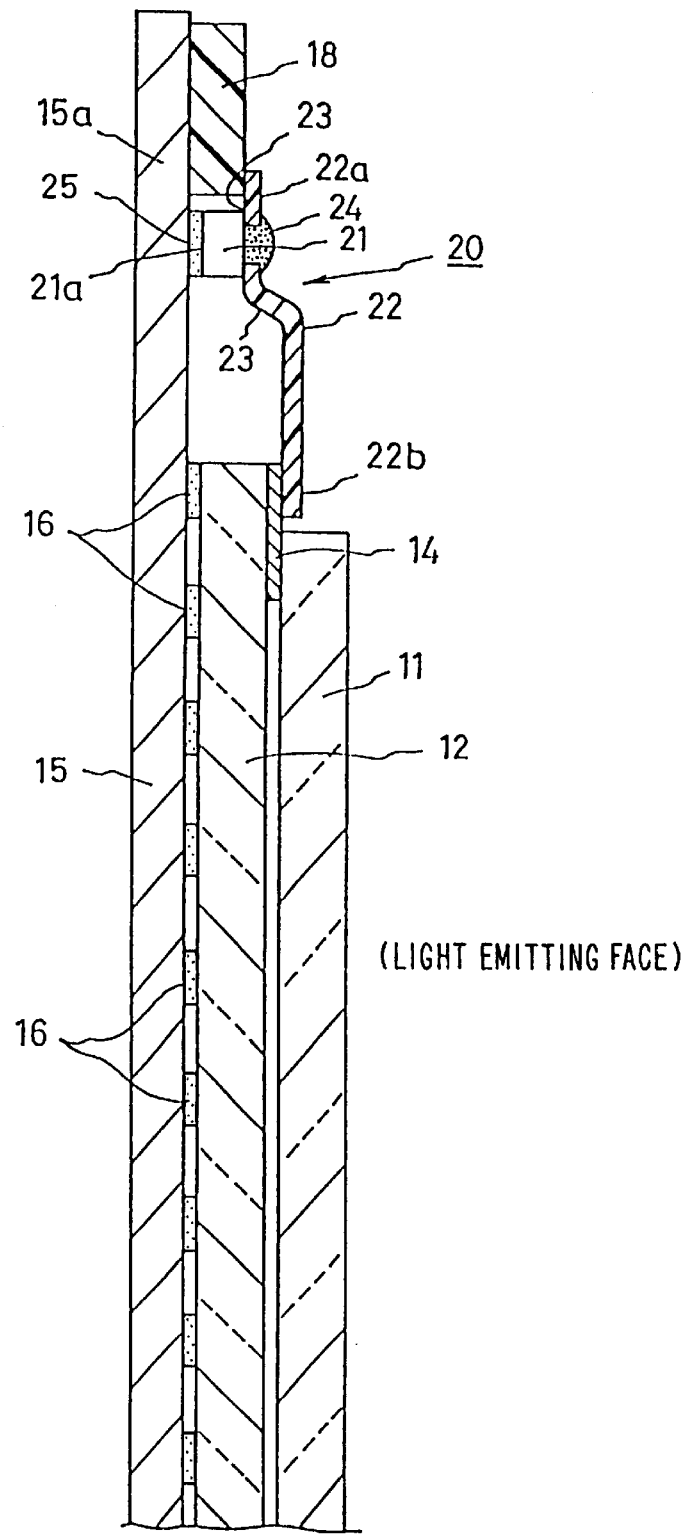
FIG. 2 is a side cross-sectional view at a II—II line shown in FIG. 1.

As shown in FIGS. 1 and 2, a color PDP 10 is configured to display required information by combining two glass sheets 11 and 12, and causing plasma discharge to take place in the gap formed between them. A metal reinforcing plate 15, for example, consisting of aluminum alloy is installed on the back side of the color PDP 10, especially, on the back side of the rear glass sheet 12. The plate 15 is connected to the rear glass sheet 12 by an adhesive tape 16. The plate 15 has an extending portion 15a which is extended toward outside of the color PDP 12. On the extending portion 15a, IC chips 21 and a printed wiring board (PWB) 18 for input signals are formed. IC chips 21 are fixed on the plate 15a by, for example, a heat-conducting adhesive transcription tape 25. The printed wiring board 18 has signal wirings (not shown) thereon to electrically connect to the respective wirings (not shown) on a flexible printed wiring board 22, that is, the respective driver ICs 21 on a flexible printed board 22. The flexible printed board 22 has an input wiring terminal 22a for inputting signals from the board 18. A plurality of electrodes 14 for data signals are formed on a side edge part formed by slightly extending sideways a rear glass sheet 12 on its front side beyond a front glass sheet 11 shown in FIG. 2. The flexible printed wiring board 22 has output wiring terminals 22b connected to each of the plurality of electrodes 14. The flexible printed wiring board 22 is a module formed by a tape automated bonding (TAB) structure and is mounted with driver IC chips 21 by inner lead bonding (ILB). The flexible printed wiring board 22 includes four IC chips packaged by TAB, on the other word, tape carrier package (TCP).

Figure 4A:
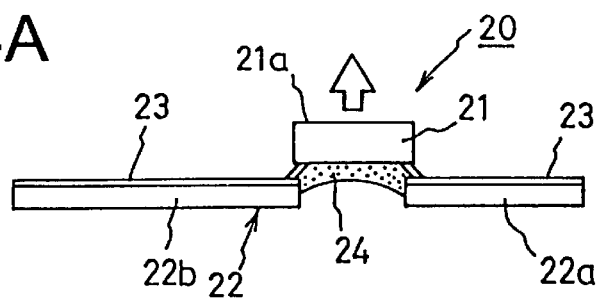
FIGS. 4A–C show an example of flexible printed wiring boards mounted with driver ICs of the present invention.

FIG. 4A shows a first example of the flexible printed wiring board 22. The flexible printed wiring board 22 is mounted on the driver IC 21 by TAB. The flexible printed board 22 has conductive lines 23 on one side surface thereof. The conductive lines 23 are connected to the respective electrodes of the driver IC 21. Further, the board 22 has an opening above which the driver IC 21 is arranged. A sealing resin 24 seals between the driver ICs 21 and the flexible printed board 22 to hermetically seal the electrodes and flexible printed board 22. It is noted that the arrow indicates a direction connected to the plane 15.

Figure 4B:
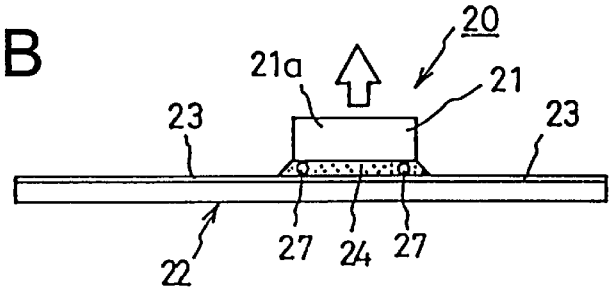

FIG. 4B shows a second example of the flexible printed wiring board 22. The driver IC 21 has a plurality of ball bumps 27 and each ball bumps 27 is connected to the respective conductive line 23. The driver IC 21 is sealed with the board 22 by a resin 24. The board 22 does not have an opening. This package is called flip chip package.

Figure 4C:
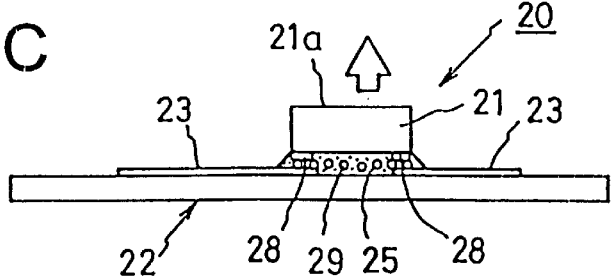

FIG. 4C shows a third example of the flexible printed wiring board 22. The board 22 is coupled with the driver IC 21 by utilizing anisotropic electro-conductive adhesive (ACF) 25. A driver IC 21 has a plurality of Au-plated bumps 28 and is mounted on the board 22 so that each bumps 28 connects to the respective conductive line 23 through conductive balls 29. The ACF 25 is also used as a resin for sealing. The above-mentioned packaging method is called a face down bonding because the surface having bumps of the driver IC 21 faces below and connects to the top surface of the board 22.

According to the present invention the driver ICs 21 for the flat panel type display apparatus are directly fixed onto an extending part 15a of the Aluminum reinforcing plate 15. Further, the driver ICs 21 are fixed on the plate 15 with the adhesive tape 25 which is excelling in heat conductivity. The heat generated in the driver ICs 21 are therefore radiated by utilizing the extended part 15a of the aluminum reinforcing plate 15 as a heat sink. Since the drivers ICs 21 is mounted on the flexible printed wiring boards 22 without the addition step of attaching a separate heat sink, the apparatus excel in mass producibility and can be reduced in cost. Such a configuration makes it possible to reduce the thermal resistance in each driver IC 21, ensure operational reliability, and enhance durability. Further, the length of the relatively expensive flexible printed wiring boards 22 can be minimized. As the length of the flexible printed wiring board is shortened, the wiring capacity can be reduced, and the load on the driver ICs can be alleviated. The apparatus therefore can improve the performance of the display control as well as reduce cost. Especially, by applying the invention to a PDP in which data side driver ICs are mounted in the display apparatus where the effect of heat radiation from a part having a high calorific value (e.g power dissipation) such as a color PDP for instance, results in enhanced operational reliability of the driver ICs.

Figure 5:
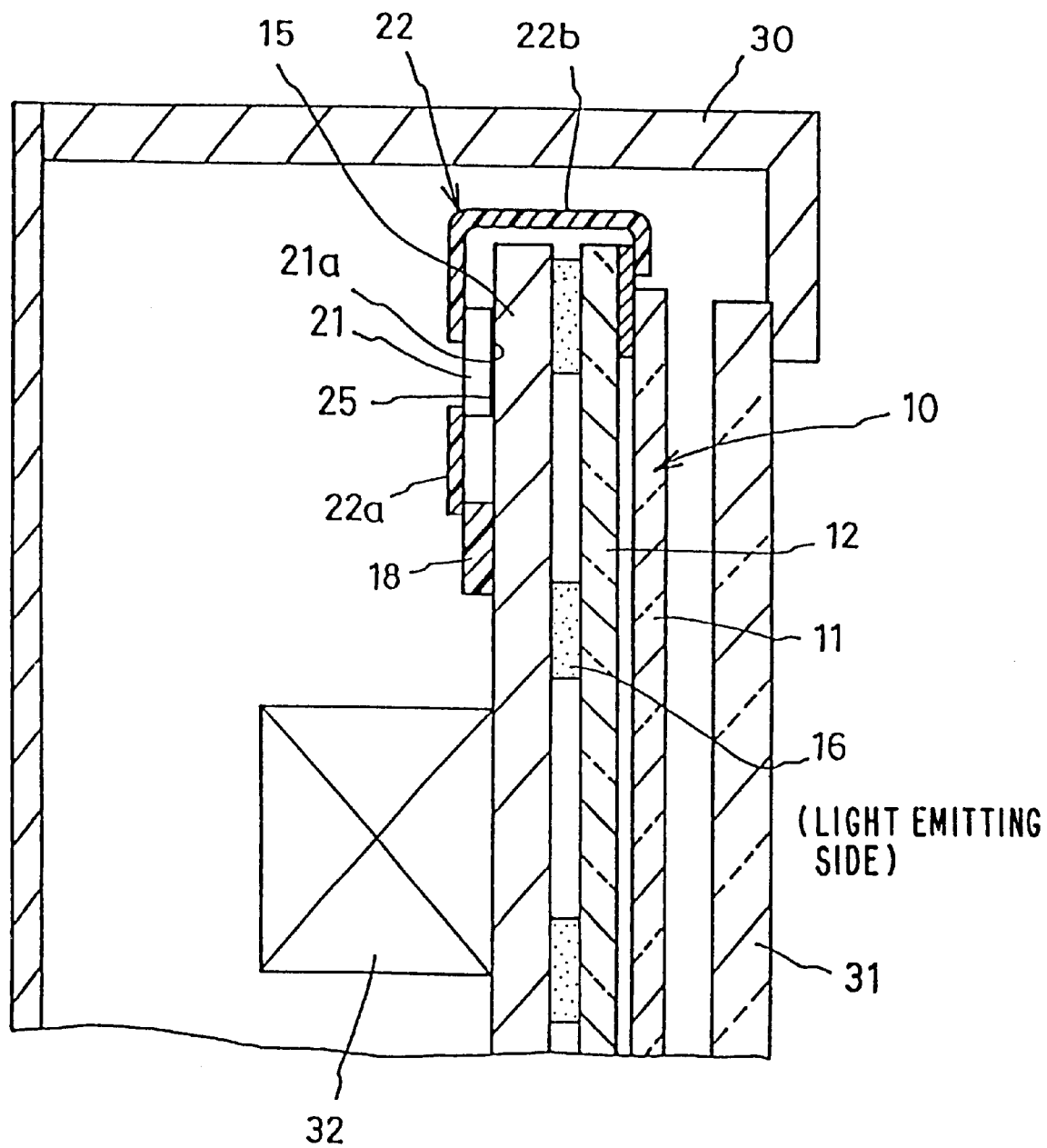
FIG. 5 is a side cross-sectional view of a second embodiment of a flat panel type display apparatus according to the present invention.
Figure 6:
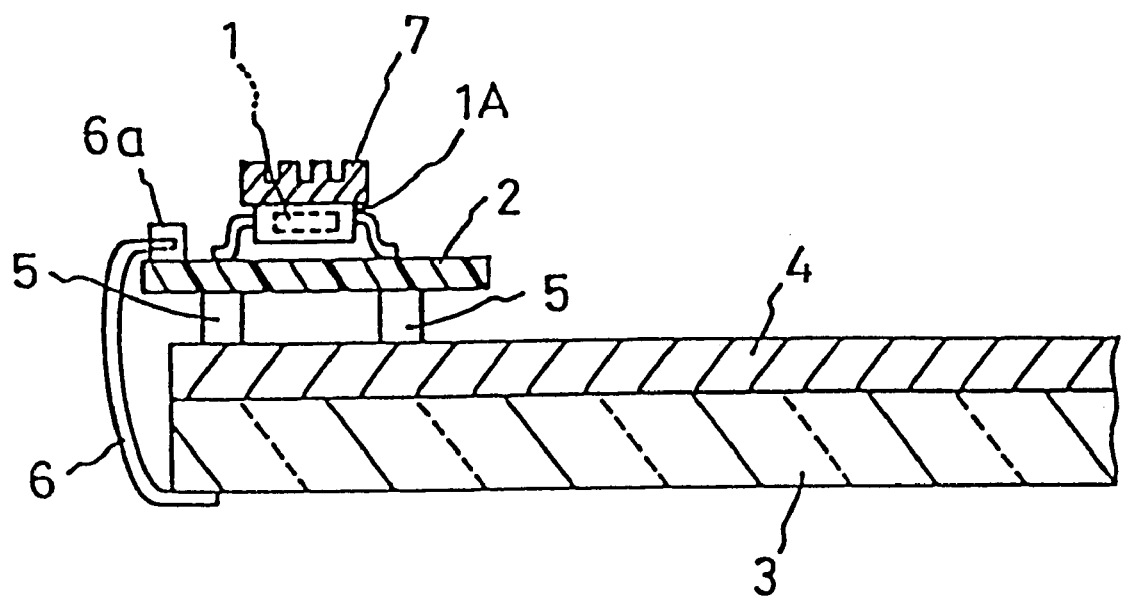
FIG. 6 is a side-sectional view of a flat panel type display apparatus of the related art.

FIG. 5 illustrates a second embodiment of the flat panel type display apparatus according to the present invention. The driver ICs 21 mounted on the flexible printed wiring board 22 are turned round to the back side of the aluminum reinforcing plate 15 and directly fixed to the plate 15 with, for example, a heat-conductive adhesive transcription tape 25. The color PDP 10 and the aluminum reinforcing plate 15 are aligned on the side edge part. Such a structure is suitable for a color PDP 10 which has to be built into a space limited by, for instance, a housing 30. It is noted that a transparent acrylic plate 31 is installed to convey the opening part of the housing frame 30 on the light emitting side of the PDP panel 10. A built-in portion 32 is mounted on the rear face of the aluminum reinforcing plate 15 to fix the PDP panel 10.

It is apparent that the present invention is not limited to the above embodiment but may be modified and changed without departing from the scope and spirit of the invention. For instance, there may be either one or plural driver IC(s) 21 and mounted to one or more flexible printed wiring board(s) 22. The metal-built reinforcing plate 15 is not limited to an aluminum reinforcing plate 15, but may be anything else that has a function to reinforce the PDP 10 and act as a heat sink to thereby radiate heat away from the driver IC(s). The driver IC may be connected to the flexible printed wiring board 22 by a wire-bonding. A color PDP 10 for use in a wide television receiver with a large screen display was cited as an example, the display is not limited to this example, but may as well be, for instance, a liquid crystal display (LCD), an electro-luminescence (EL) display, an LED display, or the like.

Further, any means can be used to directly join the driver IC(s) 21 to the aluminum reinforcing plate 22, as long as it has excellent heat conductivity and maintains its integrity under the heat from the driver IC(s). For example, an adhesive which is excellent in heat conductivity may be chosen. Also, since such driver ICs 21 essentially need to be only fitted so as to come into contact with the metal-built reinforcing plate 22, brackets or the like may be fitted to pinched the IC(s) to the metal-built reinforcing plate 22. The board 15 may be directly connected to driver ICs not only on the data side but also on the scan side.

What is claimed is:
1. An apparatus comprising:
   a metal plate having a top surface, said top surface having a first portion, a second portion and a third portion between said first and second portion;
   a first glass sheet formed on said first portion of said metal plate, said first glass sheet having an end portion on which an electrode is formed;
   a second glass sheet formed on said first glass sheet;
   a printed wiring board formed on said second portion of said metal plate and having at least one signal wiring line;
   a chip formed on said third portion of said metal plate; and
   a flexible printed wiring board connected between said printed wiring board and said chip and between said chip and said electrode of said first glass sheet.

2. The apparatus claimed in claim 1, wherein said metal plate is an aluminum alloy plate.

3. The apparatus claimed in claim 1, wherein said chip is connected to said metal plate by an adhesive having a heat-conductive characteristic.

4. The apparatus claimed in claim 1, wherein said chip is coupled to said flexible printed wiring board by a tape automated bonding.

5. An apparatus comprising:
   a metal plate having a top surface and a bottom surface, said bottom surface having a first portion and a second portion, said second portion being closer to a peripheral portion of said metal plate than said first portion;
   a first glass sheet formed on said top surface of said metal plate, said first glass sheet having an end portion on which an electrode is formed;
   a second glass sheet formed on said first glass sheet;
   a printed wiring board formed on said first portion of said metal plate and having at least one signal wiring line;
   a IC chip formed on said second portion of said metal plate; and
   a flexible printed wiring board connected between said printed wiring board and said IC chip and between said IC chip and said electrode such that said flexible printed wiring board goes around said peripheral portion of said metal plate.

6. The apparatus claimed in claim 5, wherein said metal plate is an aluminum alloy plate.

7. The apparatus claimed in claim 5, wherein said IC chip is connected to said metal plate by an adhesive having a heat-conductive characteristic.

8. The apparatus claimed in claim 5, wherein said IC chip is connected to said flexible printed wiring board by a tape automated bonding.

9. An display apparatus comprising:
   a display panel including signal wiring lines arranged at a matrix on vertical and horizontal directions;

a reinforcing plate having a heat radiating characteristic adhered to said display panel, said plate having a first projecting portion projected from a first end of said display panel and a second projecting portion projected from a second end of said display panel, said first end of said display panel being perpendicular to said second end of said display panel;

a plurality of first wiring boards arranged on said first projecting portion of said plate, each of said first wiring boards having at least a first signal wire coupled to a corresponding one of said signal wiring lines arranged on said vertical direction;

a plurality of first IC chips formed on said first projecting portion of said plate, each of said first IC chips driving said first signal wire of a corresponding one of said first wiring boards;

a plurality of second wiring boards arranged on said second projecting portion of said plate, each of said second wiring boards having at least a second signal wire coupled to a corresponding one of said signal wiring lines arranged on said horizontal direction; and a plurality of second IC chips formed on said second projecting portion of said plate, each of said second IC chips driving said second signal wire of a corresponding one of said second wiring boards.

* * * * *